(12) United States Patent
Carpenter et al.

(10) Patent No.: US 10,003,171 B1
(45) Date of Patent: Jun. 19, 2018

(54) SEALED LASER DIODE HEAT SINK MODULE

(71) Applicant: Excelitas Technologies Corp., Waltham, MA (US)

(72) Inventors: Scott Carpenter, Elgin, IL (US); Wai Choi, Schaumburg, IL (US)

(73) Assignee: Excelitas Technologies Corp., Waltham, MA (US)

( * ) Notice: Subject to any disclaimer, the term of this patent is extended or adjusted under 35 U.S.C. 154(b) by 0 days. days.

(21) Appl. No.: 15/711,350

(22) Filed: Sep. 21, 2017

(51) Int. Cl.
*H01S 3/04* (2006.01)
*H01S 5/024* (2006.01)
*H01S 5/042* (2006.01)
*F21V 29/70* (2015.01)

(52) U.S. Cl.
CPC ......... *H01S 5/02469* (2013.01); *F21V 29/70* (2015.01); *H01S 3/0405* (2013.01); *H01S 5/0425* (2013.01)

(58) Field of Classification Search
CPC ............ H01S 3/06716; H01S 3/10015; H01S 5/02469
USPC ........ 372/21, 25, 34, 36, 35; 359/329, 341.1
See application file for complete search history.

(56) References Cited

U.S. PATENT DOCUMENTS 8,340,144 B1 * 12/2012 Grove ................. H01S 5/02264
372/34

OTHER PUBLICATIONS

Arroyo Instruments—242 TEC C-Mount LaserMount; downloaded Sep. 14, 2017.
Laser Diode Source; C-mount Laser Diode Heat Sink and Cooling Module from ILX Lightwave; downloaded Sep. 14, 2017.
ThorLabs; C-Mount Laser Mount with Temperature Stabilization; downloaded Sep. 14, 2017.
ThorLabs; Passive Thermal Mount for One-Tab C-Mount Diode Lasers; downloaded Sep. 14, 2017.

* cited by examiner

*Primary Examiner* — Tuan Nguyen
(74) *Attorney, Agent, or Firm* — Peter Nieves; Sheehan Phinney Bass & Green PA

(57) ABSTRACT

A sealable laser diode heat sink module for a laser diode includes an anode assembly and a cathode assembly having a cathode base and a cathode connector plate. The anode assembly includes an anode base configured to house the laser diode and the cathode base within a sealable cavity recessed into the anode base. The anode base has a cathode base opening configured to receive the cathode connector plate. An anode connector plate extends from the anode base. An anode current path passes through the laser diode and the anode connector plate via direct connections through the anode base. A cathode current path passes through the cathode connector plate passes via direct connections through the cathode base. The anode base is configured to dissipate heat from the laser diode.

18 Claims, 8 Drawing Sheets

OPEN LASER CAVITY

SEALED LASER DIODE HEAT SINK MODULE

FIELD OF THE INVENTION

The present invention relates to thermal management of electronic devices, and more particularly, is related to a sealed heat sink with sealed electrical connections for a laser device.

BACKGROUND OF THE INVENTION

A heat sink is a passive heat exchanger that transfers the heat generated by an electronic or a mechanical device to a fluid medium, for example air or a liquid coolant, where heat is dissipated away from the device, thereby allowing regulation of the temperature of the device at desired levels. Heat sinks are used with high-power semiconductor devices such as power transistors and optoelectronics such as lasers and light emitting diodes (LEDs), where the heat dissipation ability of the component itself is insufficient to moderate its temperature.

A heat sink is designed to maximize its surface area in contact with the cooling medium surrounding it, such as the air. Air velocity, choice of material, protrusion design and surface treatment are factors that affect the performance of a heat sink. Heat sink attachment methods and thermal interface materials also affect the die temperature of the integrated circuit.

Open frame laser chips such as C-mount, B-mount, Q-mount, and F-mount copper packages, have typically been mounted on simple heat sinks. FIG. 1 shows a prior art C-mount arrangements for a laser chip, where the arrangements include an open laser cavity. It is desirable to protect the exposed facets of the laser chips from mechanical contact, foreign material, dust, and debris, as contaminated laser facets can cause immediate and permanent damage. For example, such damage could prematurely degrade the life of the laser. In particular, open frame laser chips may be vulnerable to heat damage or exposure to contamination when they are soldered, for example, to a printed circuit assembly.

High current/output power lasers also require adequately sized electrical connections to operate the laser. For example, harnesses for high current applications typically require large wire sizes, for example 5 AWG to 18 AWG and are also limited by the current rating of the crimp required to attach the wire to the mating connector. Further, properly sized electrical connections to the laser are typically large and bulky. Using large electrical connections and completely sealing the laser from outside elements has resulted in very large laser module solutions, for example sealed panel mounted electrical connectors with mounting hardware such as gaskets, washers, and nuts, which may be impractical for some applications. Therefore, there is a need in the industry to address one or more of the abovementioned shortcomings.

SUMMARY OF THE INVENTION

Embodiments of the present invention provide a sealed laser diode heat sink module. Briefly described, the present invention is directed to a sealable laser diode heat sink module for a laser diode having an anode assembly and a cathode assembly with a cathode base and a cathode connector plate. The anode assembly includes an anode base configured to house the laser diode and the cathode base within a sealable cavity recessed into the anode base. The anode base has a cathode base opening configured to receive the cathode connector plate. An anode connector plate extends from the anode base. An anode current path passes through the laser diode and the anode connector plate via direct connections through the anode base. A cathode current path passes through the cathode connector plate via direct connections through the cathode base. The anode base is configured to dissipate heat from the laser diode.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1:
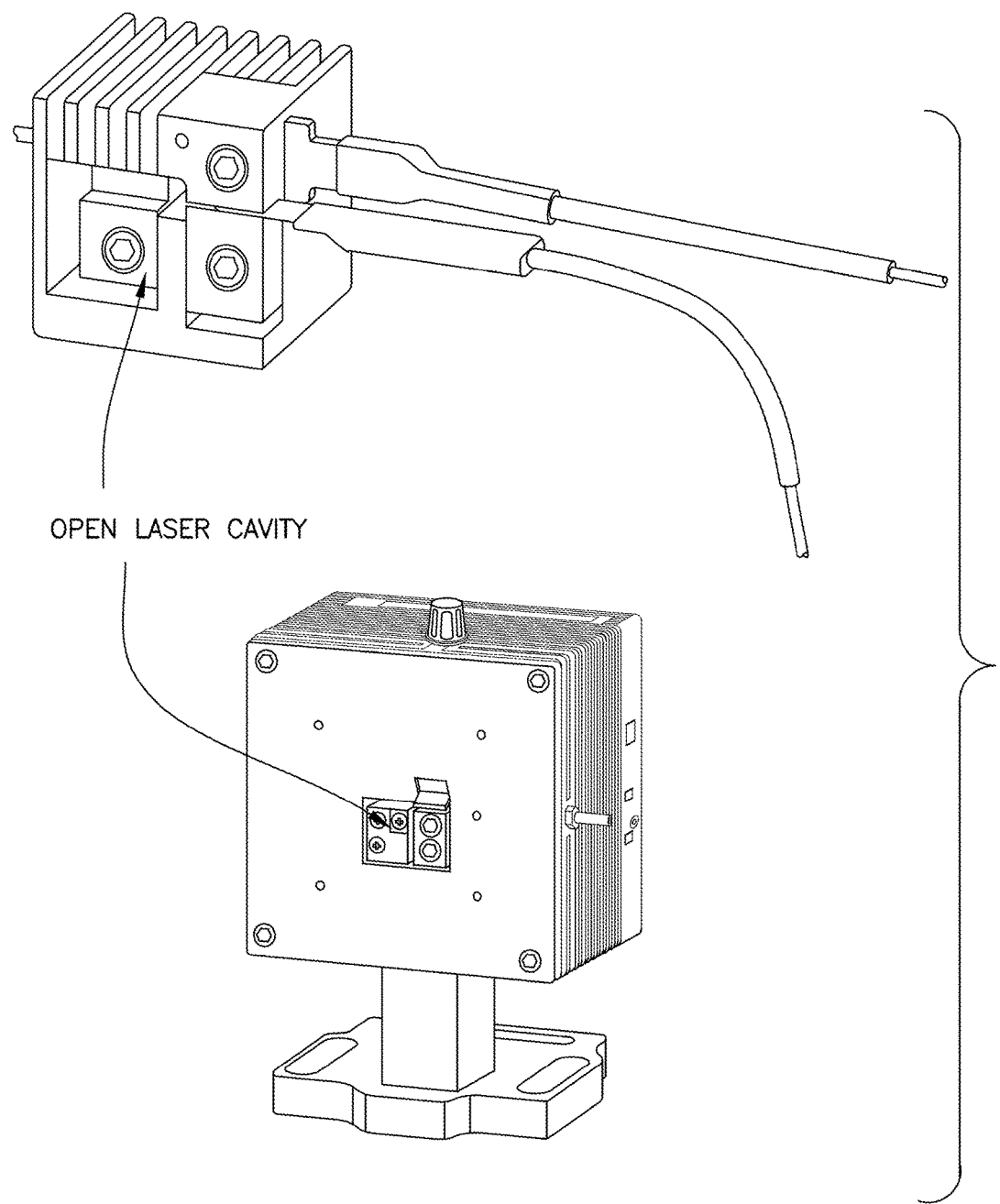
FIG. 1 shows two prior art heat sink arrangements for laser devices.

The following definitions are useful for interpreting terms applied to features of the embodiments disclosed herein, and are meant only to define elements within the disclosure.

As used within this disclosure, a "high current application" refers to an application, for example a semiconductor device such as a laser diode that operates at a current of 1 Amp up to 100 Amps.

As used within this disclosure, "direct contact" or "direct connection" means a surface to surface electrical connection without intervening wire leads or trace leads. In preferred embodiments, the direct contact/connection may be accomplished without soldering the electrical connection.

As used within this disclosure, "integral" means formed as a single contiguous unit, in contrast with an assembly that may be formed by attaching separate components together.

As used within this disclosure, "substantially" means approximately, within reasonable manufacturing tolerances.

Reference will now be made in detail to embodiments of the present invention, examples of which are illustrated in the accompanying drawings. Wherever possible, the same reference numbers are used in the drawings and the description to refer to the same or like parts.

Figure 2A:
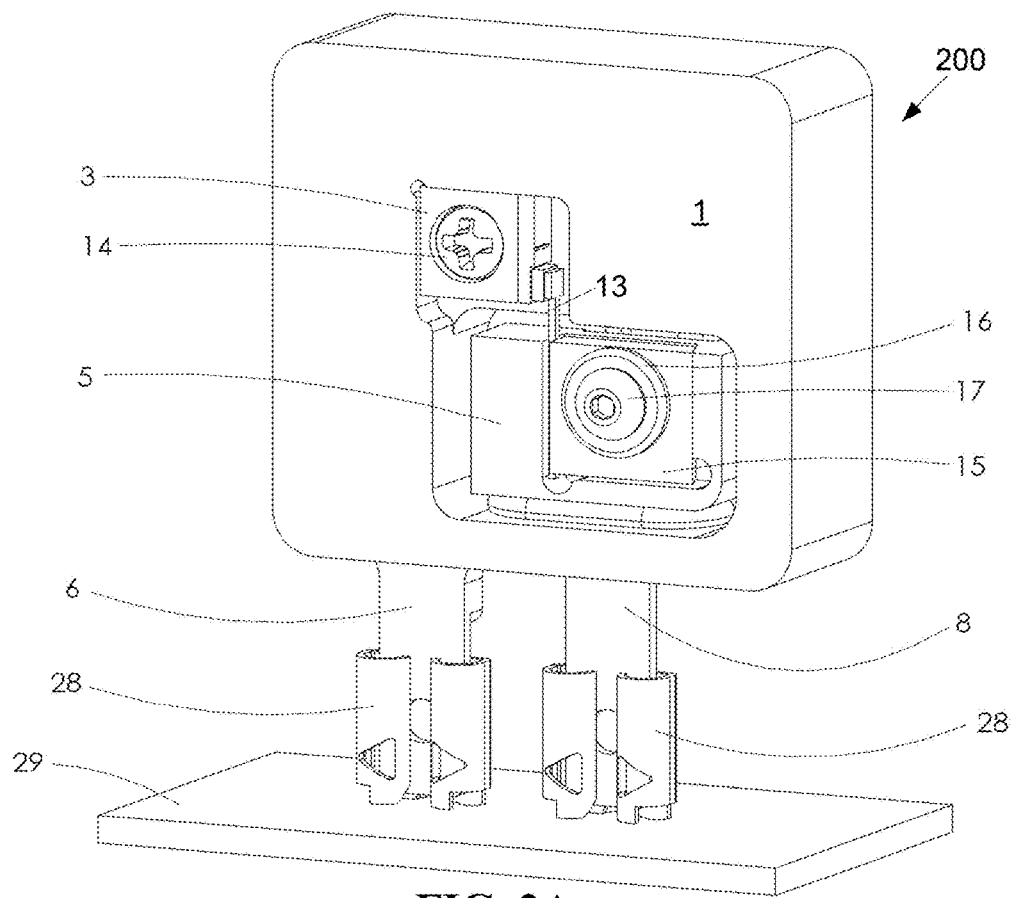
FIG. 2A is a schematic diagram of an exemplary first embodiment of a sealable laser diode mount with heat sink from a perspective view.

FIG. 2A shows a first exemplary embodiment of a sealable laser diode heat sink assembly 200. The arrangement of components in the sealable laser diode heat sink assembly 200 protects a laser diode 3, for example as described further below, an open frame laser diode 3 within a sealable cavity 310 (FIG. 3A) encapsulating an anode connector plate 6 and a cathode connector plate 8 electrical connectors while transferring the heat from the laser diode 3 through an anode base 1 in a compact solution.

Figure 3A:
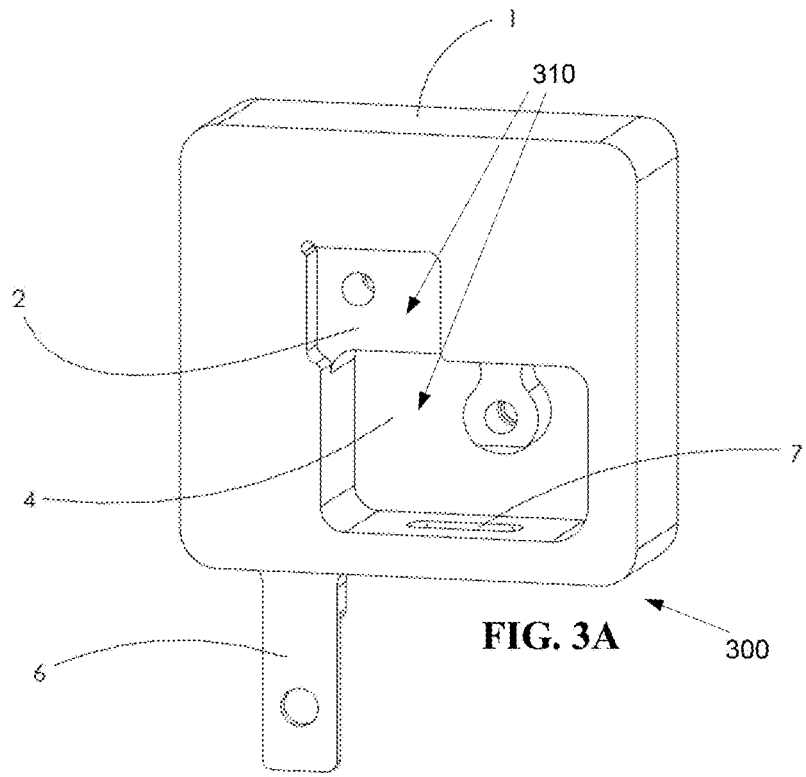
FIG. 3A is a schematic diagram of the anode base portion of the sealed laser diode mount of FIG. 2A in isolation.
Figure 3B:
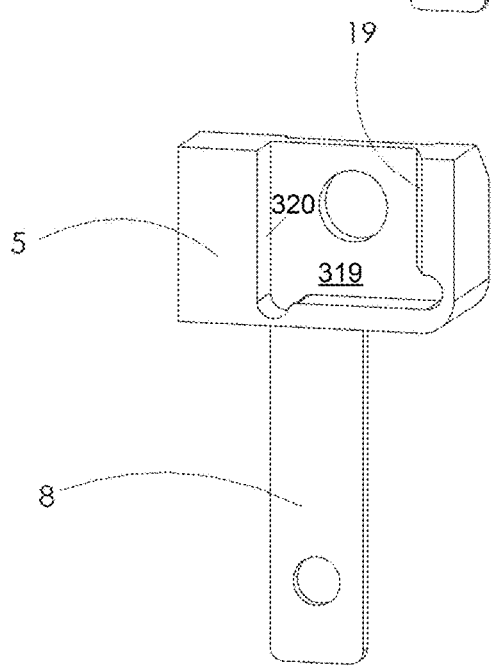
FIG. 3B is a schematic diagram of the cathode base portion of the sealed laser diode mount of FIG. 2A in isolation.

As shown in FIG. 3A, an anode assembly 300 of the sealable laser diode heat sink assembly 200 (FIG. 2A) includes the anode base 1 that is configured to sealably house the laser diode 3 (FIG. 3D) and a cathode assembly 350 (FIG. 3C) within the sealable cavity 310 recessed into the anode base 1. The anode base 1 may be configured as an integral block of a current conducting and heat conveying material, for example, copper, a copper alloy, or another metal. The sealable cavity 310 may be formed within the anode base 1, preferably by machining, or for example, by etching, casting, molding, printing, or by other means. Alternatively, the anode base 1 may be formed by assembling two or more components, for example, layering substrates to form the base 1 and the sealable cavity 310.

Figure 3C:
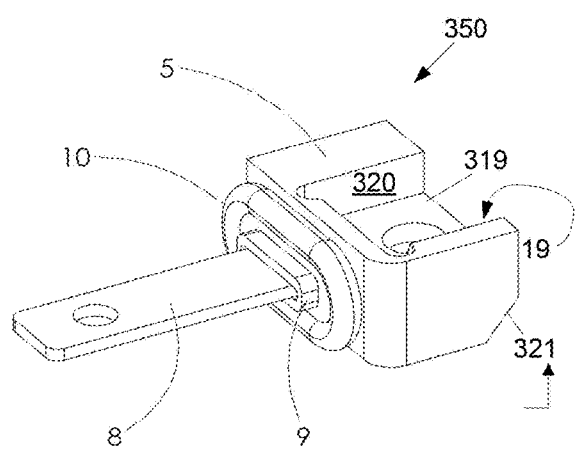
FIG. 3C is a schematic diagram of the cathode base portion of FIG. 3B from a second perspective.
Figure 3D:
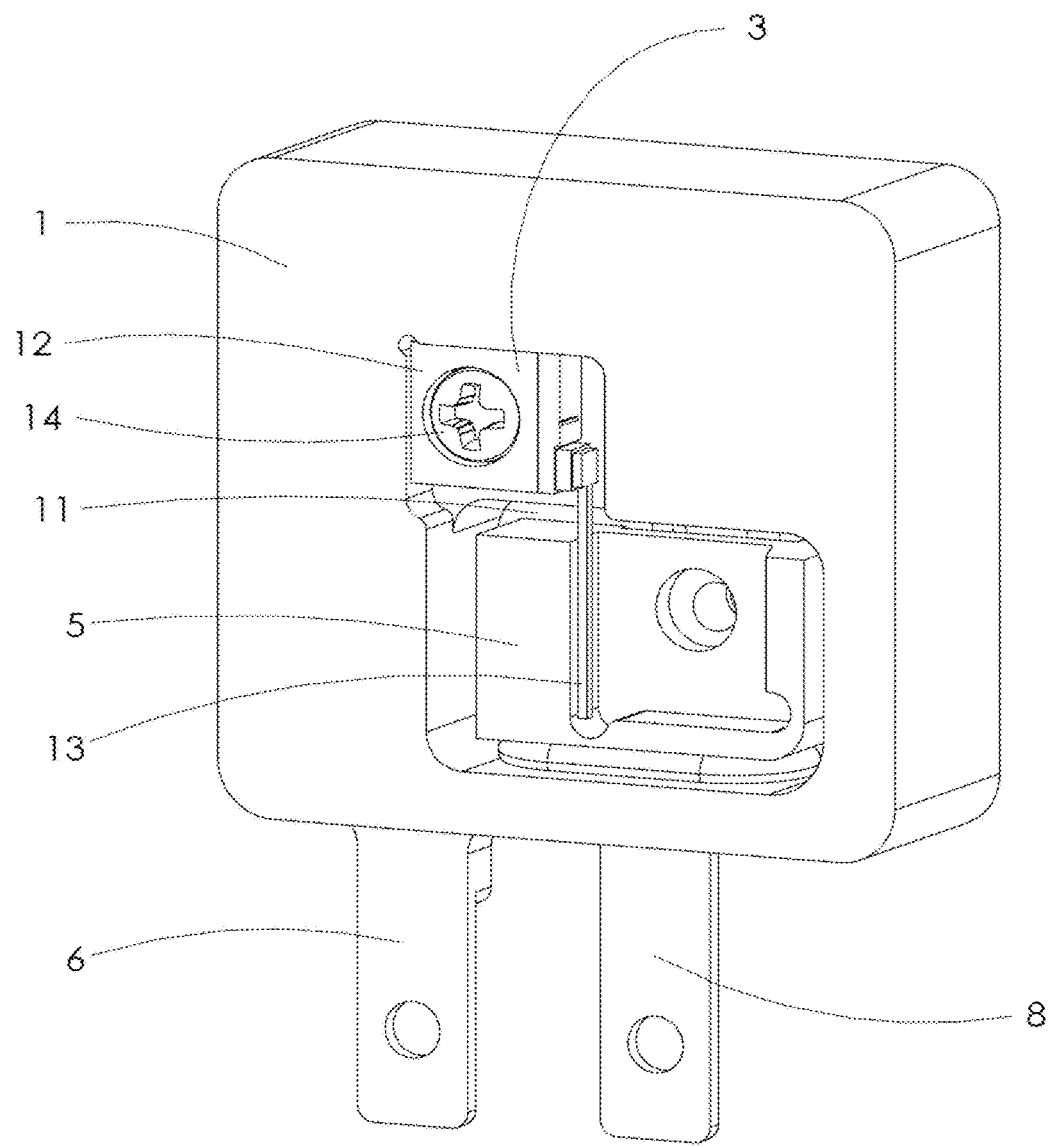
FIG. 3D is a schematic diagram of an assembly of the anode base portion of FIG. 3A and the cathode base portion of FIG. 3B.

The sealable cavity 310 of the anode base 1 may be further divided into a laser cavity 2 configured to receive and mount a laser diode 3 (FIG. 3D) and a cathode cavity 4 to receive and mount the cathode assembly 350 (FIG. 3C). The laser cavity 2 and the cathode cavity 4 may be at least partially contiguous within the sealable cavity 310, for example, to provide a path for a cathode lead post 13 (FIG. 3D) to convey current between the laser cavity 2 and the cathode cavity 4. In alternative embodiments, the laser cavity 2 and the cathode cavity 4 may be formed as physically isolated compartments, having only an electrical connection.

The anode connector plate 6 may be integral with the anode base 1 and extends from the anode base 1 to provide an electrical connection to an anode terminal of the laser diode 3 via the anode base 1. Alternatively, the anode connector plate 6 may be attached to the anode base 1.

A cathode base opening 7 within the cathode cavity 4 of the anode base 1 may be configured to allow the cathode connector plate 8 (FIG. 3B) of the cathode base 5 (FIG. 3B) to pass thru from the cathode cavity 4 of the anode base 1 when the cathode base 5 (FIG. 3B) is inserted into the cathode cavity 4.

As seen in FIG. 3C, a cathode connector insulator 9 extends from the cathode base 5 and electrically isolates the cathode connector plate 8 from the cathode base opening 7 (FIG. 3A) in the anode base 1. A cathode connector gasket 10 may mechanically seal the cathode base opening 7 (FIG. 3A) between the cathode base 5 and the anode base 1. A cathode base insulator 11 (FIG. 2B) electrically isolates the cathode base 5 from the anode base 1 (FIG. 3A) within the cathode cavity 4 (FIG. 3A). The cathode connector insulator 9, the cathode connector gasket 10 and/or the cathode base insulator 11 may preferably be formed of a non-conducting material, for example, plastic or rubber.

The laser diode 3 has an anode connection and a cathode electrical connection, for example, an anode terminal and a cathode terminal. A laser diode mounting base 12 may serve as the anode terminal of the laser diode 3. The cathode lead post 13 (FIG. 3D) may serve as the cathode terminal of the laser diode 3. The laser diode 3 may be assembled into the laser cavity 2 with a fastener, for example, a first screw 14 under the first embodiment, for example, a copper or brass screw. The first screw 14 and the laser diode mounting base 12 may be electrically connected to the anode base 1.

The cathode lead post 13 is typically included as part of a commercial assembly package for the laser diode 3, and the cathode lead post 13 is preferably formed of a solid conducting material, for example, copper, and configured to conduct sufficient current according to the current dissipation capacity of the laser diode 3. The cathode lead post 13 may be configured as a wide, thin strip of conducting material extending from the laser diode 3. Under the first embodiment, the geometry of a typical cathode lead post 13 may provide an adequate electrical connection between the cathode base 5 and the cathode lead post 13 without soldering.

For example, an adequate electrical direct connection may be made between the cathode base 5 and the cathode lead post 13 without soldering by leveraging a flat surface area along the length of the lead post 13 for attachment to the cathode base 5, for example, via a friction attachment to a similarly large, flat portion of the cathode base 5, as described further below. The electrical contact portion of the cathode lead post 13 may provide a greater surface area for electrical contact than a contact wire. For example, the electrical contact portion of the cathode lead post 13 may include a flat, wide electrical connecting surface to provide a greater electrical contact area than that provided by, for example, a wire lead with a circular cross section. Such a direct connection is preferable to a solder connection, for example, because it eliminates the soldering process as a source of potential heat damage to the laser diode 3 or contamination of the laser diode 3.

Figure 2B:
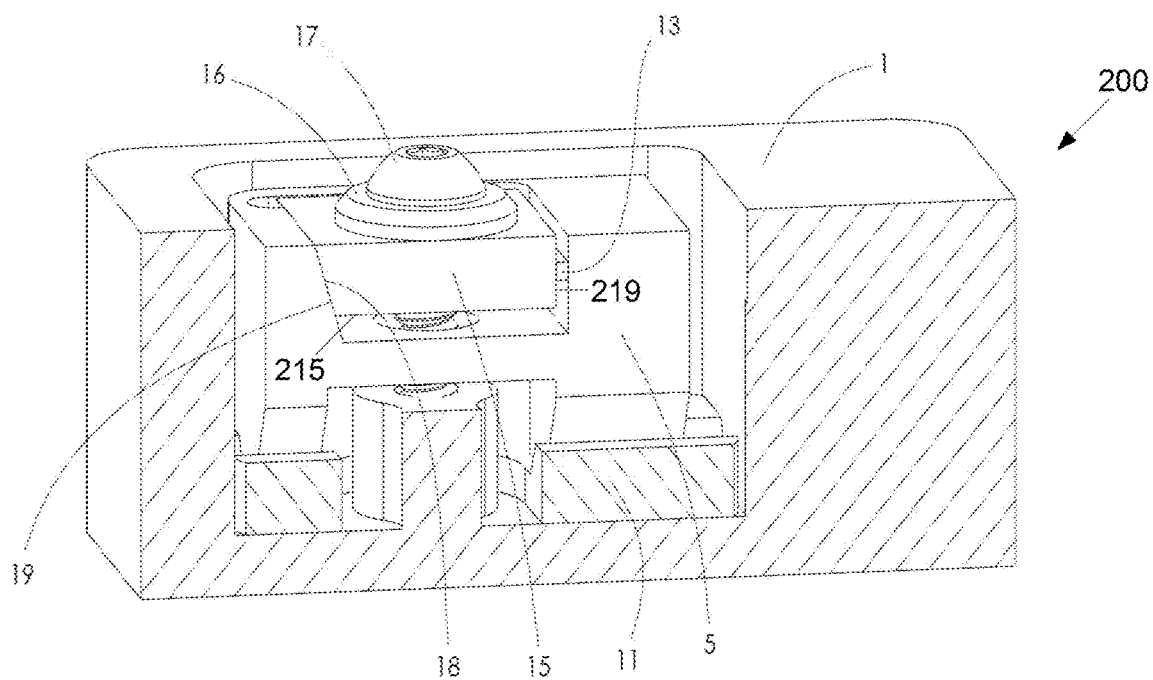
FIG. 2B is a cutaway view of the sealed laser diode mount of FIG. 2A.

As shown by FIG. 2B, an electrical connection for the cathode lead post 13 may be made when a cathode clamp 15 is attached to the anode base 1, for example with an insulating shoulder washer 16 and a second screw 17. The cathode clamp 15 has a clamp lead contact surface 219 opposite a cathode clamp ramp surface 18. The cathode clamp ramp surface 18 is oriented at a clamp ramp angle in the range of 91° to 179° with respect to a bottom surface 215), preferably on the order of 110°. The cathode clamp ramp surface 18 interfaces with a cathode base ramp surface 19. The cathode base ramp surface 19 is oriented at an cathode base ramp angle in the range of 91° to 179° with respect to a cathode base cavity floor 319 (see FIG. 3B), preferably on the order of 110°. When the cathode clamp ramp surface 18 and the cathode base ramp surface 19 are pressed flush together, the clamp lead contact surface 219 is substantially parallel with a cathode base lead contact surface 320 (FIG. 3B), and substantially normal to the cathode base cavity floor 319.

As the second screw 17 is tightened, the cathode clamp ramp surface 18 is forced to slide against the cathode base ramp surface 19, pushing the clamp lead contact surface 219 of the cathode clamp 15 toward the cathode base lead contact surface 320 (FIG. 3B), thereby clamping the cathode lead post 13 tightly between the clamp lead contact surface 219 of the cathode clamp 15 and the cathode base lead contact surface 320 (FIG. 3B) of the cathode base 5. This provides a direct contact electrical connection between the wide, flat electrical contact portion of the cathode lead post 13 and the clamp lead contact surface 219 of the cathode clamp 15. The cathode clamp 15 is preferably formed of a good conducting material for example, copper, a copper alloy, aluminum, or another conducting metal.

While under the first embodiment the second screw 17 is used to apply a clamping force to clamp the cathode lead post 13 tightly between the clamp lead contact surface 219 of the cathode clamp 15 and the cathode base lead contact surface 320 (FIG. 3B) of the cathode base 5, in alternative embodiments the clamping force may be applied by other means, for example, by a seal cover (not shown) when it is applied over the sealable cavity 310 (FIG. 3A).

The large contact area of the anode connector plate 6 and the cathode connector plate 8 allows a greater amount of current and/or power to operate the laser diode 3 than an arrangement using components having a lower current transfer capacity, for example wires or cables. In particular, under the first embodiment an anode current path (the anode connector plate 6 to the anode base 1 to the laser diode mounting base 12) and a cathode current path (cathode connector plate 8 to the cathode base 5 to the cathode lead post 13) is by direct contact, without any intervening current conveying components to limit the respective contact areas of the anode connector plate 6 and the cathode connector plate 8, which would not be the case if wires were used.

The anode connector plate 6 and cathode connector plate 8 may be, for example, standard connecting spades and may mate to standard female quick-disconnect terminals 28, for example, FASTON® terminals. Electrical connections to the anode connector plate 6 and cathode connector plate 8 may be made either by soldering, or by using a small, high-quality, spring contact socket. For example, such a socket may have four contact fingers, preferably where the fingers are gold-plated (see for example, parts made by Mill-Max). These mating terminals may be attached to wire harnesses and/or may be directly soldered to a PCA 29 (Printed Circuit Assembly). The anode current path and the cathode current path are preferably configured to accommodate sufficient current throughput to support high current laser components (for example, 1 Amp to 100 Amps or higher).

The sealable cavity 310 of the anode base 1 may be sealed by a sealable cover (not shown), for example, a sealable cover configured to provide for egress of a light beam from the laser diode 3. Under a second exemplary embodiment (described below), the sealable cover may also serve as a lens assembly 400.

Under the second exemplary embodiment, the electrical and/or heat dissipation features may be substantially similar to those described above regarding the first embodiment, where the sealable cover serves to house one or more optical components configured to receive the optical beam produced by the laser diode 3. Laser diodes typically employ optical components such as, but not limited to a lens to shape the profile of the optical beam coming from the laser diode 3, and/or a filter to otherwise affect the optical beam. While the second embodiment discloses a lens, lens holder, et cetera, alternative embodiments may include different and/or additional optical elements and associated components.

As shown by FIGS. 4A-4D, the lens assembly 400 includes a lens holder 21 that positions a lens 20 at a specified distance and/or orientation with respect to the laser diode 3. A lens gasket 22 is positioned up against the lens holder 21 and in contact with a surface of the lens 20, for example the outside diameter of the lens 20. A compression ring 23 with a compression ring countersink 24 is arranged against the lens gasket 22. The compression ring 23 may be configured as a ring with the cathode connector insulator 9 configured as a beveled angled surface of the compression ring 23 arranged to press against the lens gasket 22 and seal the lens gasket 22 against the lens 20 and the lens holder 21.

Figure 4A:
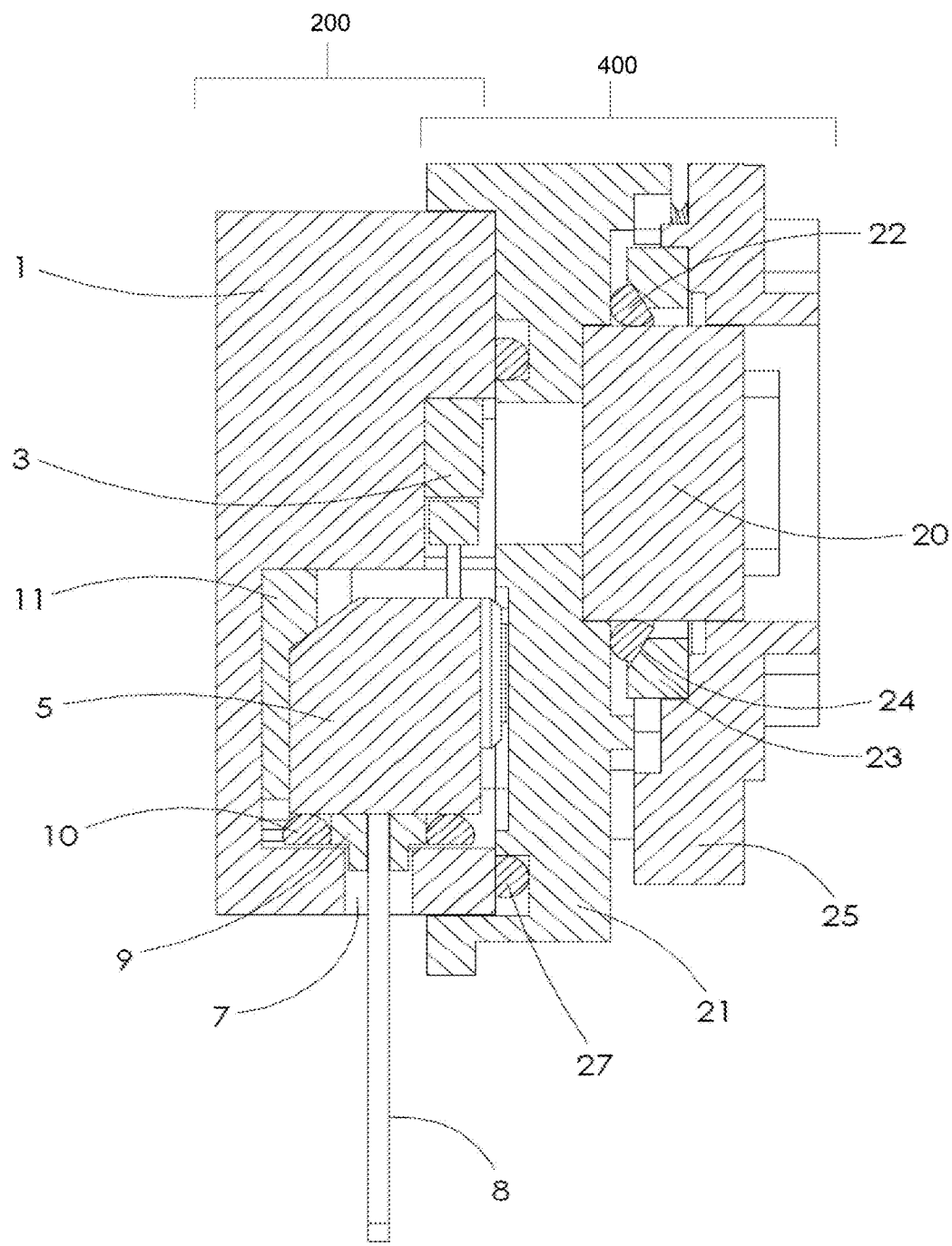
FIG. 4A is a schematic cutaway diagram of an exemplary second embodiment of a sealable laser diode mount with heat sink.
Figure 4B:
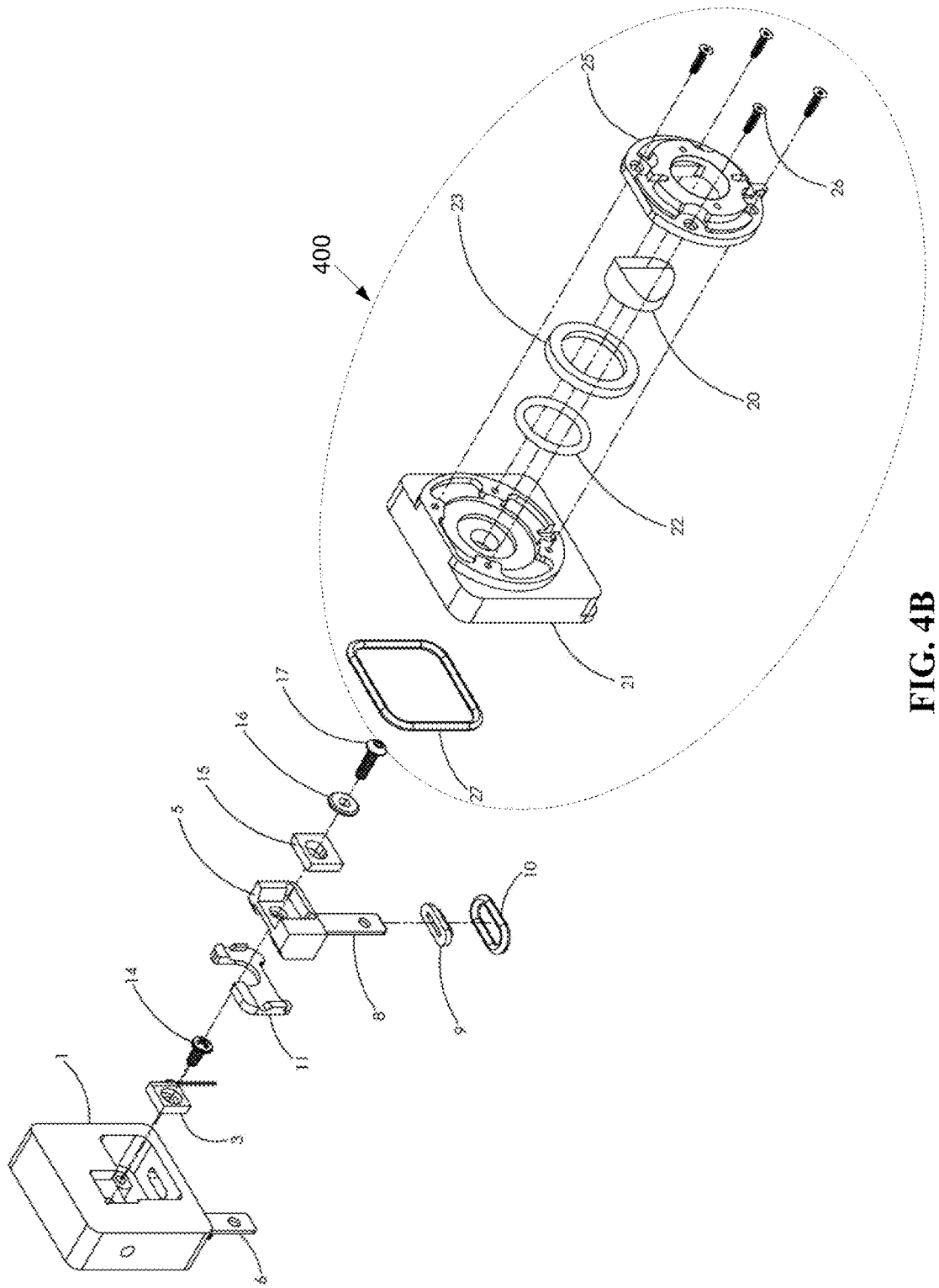
FIG. 4B is a schematic exploded diagram of the sealed laser diode mount with heat sink of FIG. 4A.
Figure 4C:
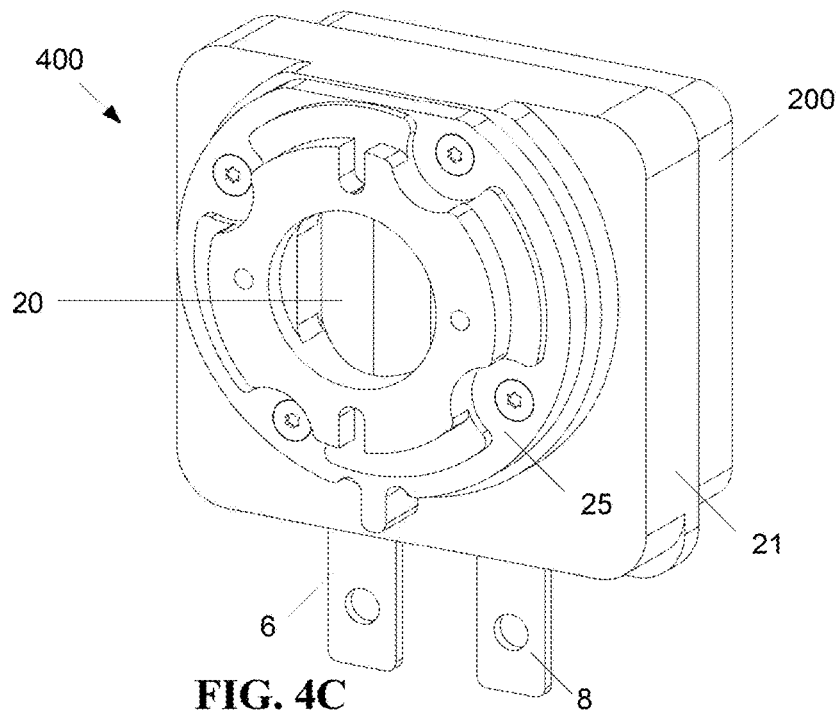
FIG. 4C is a schematic diagram of the sealable laser diode mount with heat sink of FIG. 4A from a first perspective.
Figure 4D:
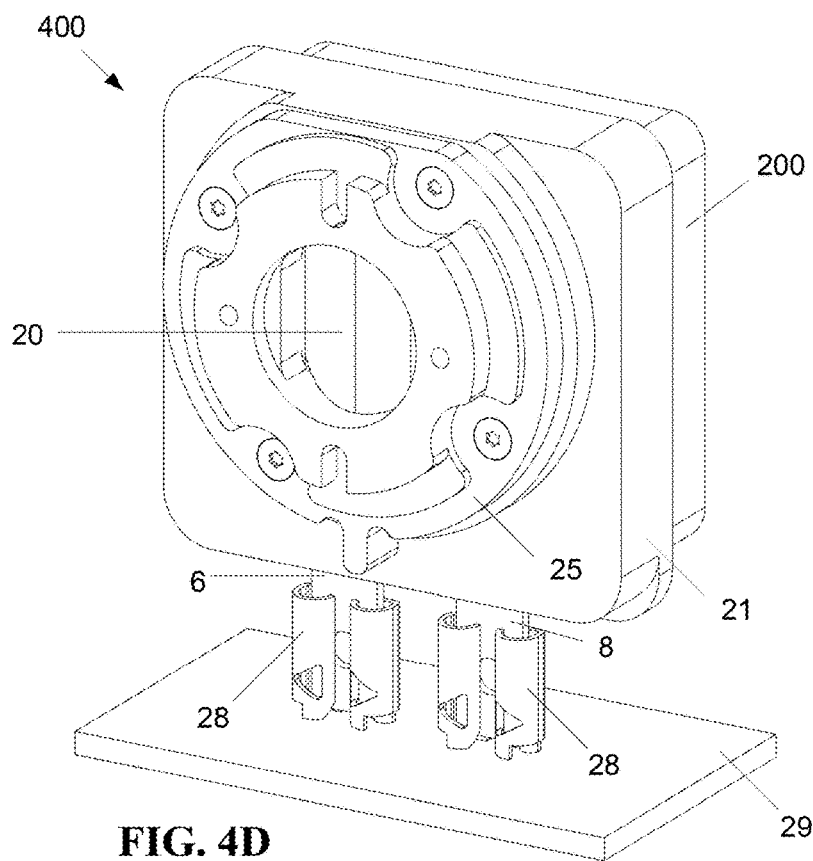
FIG. 4D is a schematic diagram of the sealed laser diode mount with heat sink of FIG. 4C as mounted to a printed circuit assembly.

A lens cap 25 may be fastened to the lens holder 21, for example, with 4 screws 26 (FIG. 4B). As the screws 26 (FIG. 4B) are tightened, the lens cap 25 applies a force to the compression ring 23 and the compression ring countersink 24 compresses the lens gasket 22 at an angle sealing the lens 20 to the lens holder 21. An anode base gasket 27 may be disposed in a groove on a back portion of the lens holder 21 facing the anode base 1 such that the lens holder 21 is mated to the anode base 1, thereby sealing the laser cavity 2 and the cathode cavity 4.

For thermal dissipation and/or electrical continuity reasons it is preferable that the anode base 1, cathode base 5, cathode clamp 15, and first screw 14 are made from highly conductive materials, such as copper. However, these components may be made from any type of metal, such as aluminum, steel, etc. For electrical isolation reasons the cathode base insulator 11 and cathode connector insulator 9 should be made from a non-conductive material, such as plastic. It is preferable that the lens holder 21, compression ring 23, and lens cap 25 are made of a non-conductive material, such as plastic, however, if desired they may be made from a conductive material, such as metal.

Figure 5:
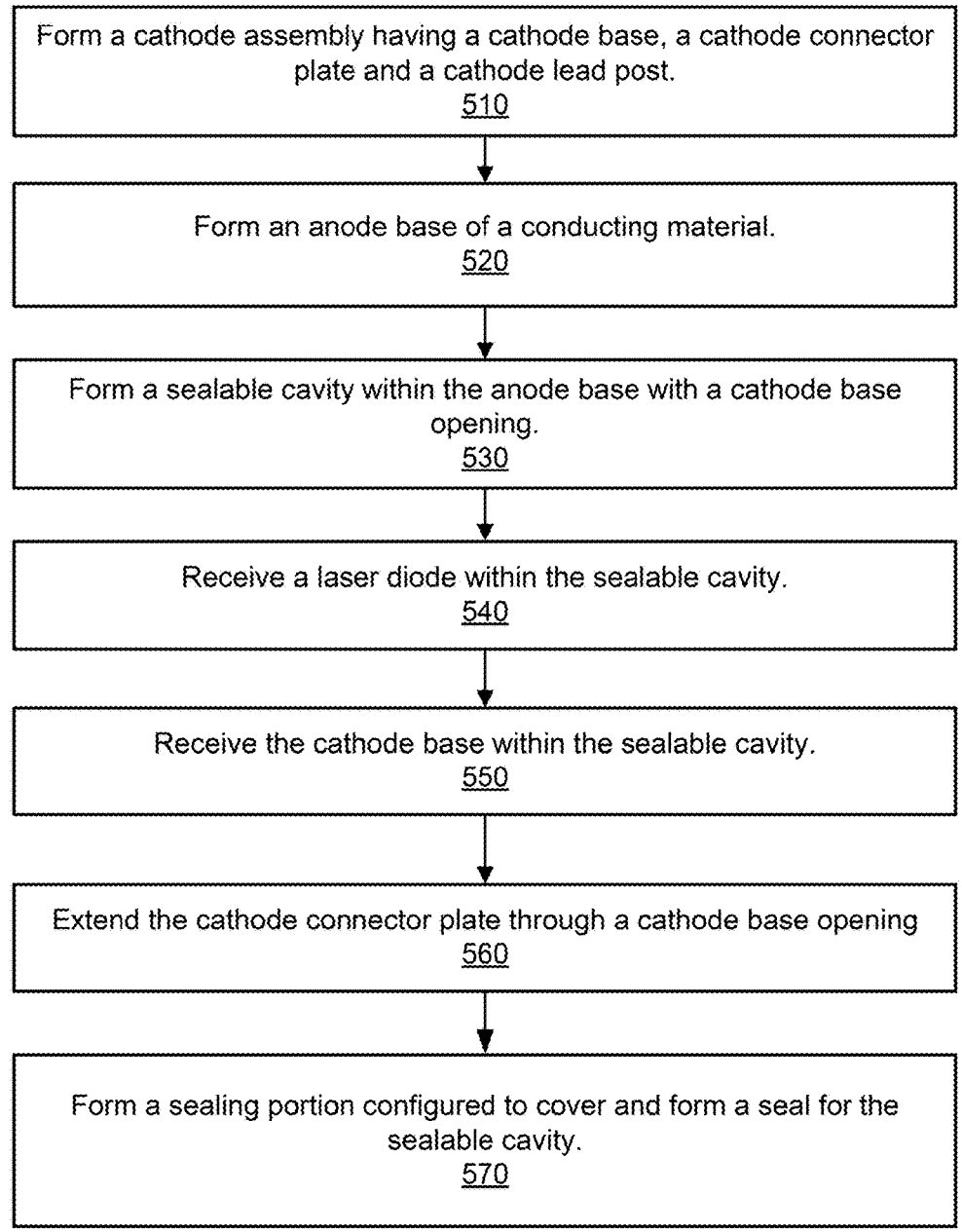
FIG. 5 is a flowchart of and exemplary method for forming a sealable laser diode heat sink assembly for an open frame laser diode.

FIG. 5 is a flowchart 500 of an exemplary method for forming a sealable laser diode heat sink assembly for an open frame laser diode. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A cathode assembly 350 is formed having a cathode base 5, a cathode connector plate 8 and a cathode lead post 13, as shown by block 510. The cathode assembly is preferably formed of a conducting material. An anode base 1 is formed of a conducting material, as shown by block 520. For example, the anode base 1 may be a block of copper. A sealable cavity 310 is formed within the anode base 1, the sealable cavity 310 having a cathode base opening, as shown by block 530. The anode base 1 and cathode base 5 may preferably be formed from a conductive material and may be processed, for example, by machining, casting, molding, etching, and/or printing, among other processes.

A laser diode 3 is received within the sealable cavity 310, as shown by block 540. The cathode base 5 is received within the sealable cavity 310, as shown by block 550. The cathode connector plate is extended through a cathode base opening 7, as shown by block 560. A sealing portion configured to cover the sealable cavity 310 and form a seal for the sealable cavity 310 is formed, as shown by block 570.

The above described embodiments have several advantages over the existing devices discussed in the Background section above. In particular, the embodiments provide direct electrical connections for high current/power applications, and sealed electrical connectors. A direct connection does not have the inherent limitations of a wire harness. Harnesses for high current applications require large wire sizes and are also limited by the current rating of the crimp required to attach the wire to the mating connector.

The laser diode 3 is sealed within a cavity to prevent moisture and dirt contamination. The anode base 1 transfers the heat away from the laser diode 3. In alternative embodiments, the anode base 1 may be attached to a number of different types of heat dissipating materials, such as finned heat sinks, heat pipes, and/or TECs (Thermal Electric Coolers). In addition, the embodiments may be implemented in a very compact manner (for example, the anode base 1 measuring less than 1.5" by 1.5" by 0.5"), resulting in significantly lower costs than existing solutions.

It will be apparent to those skilled in the art that various modifications and variations can be made to the structure of the present invention without departing from the scope or spirit of the invention. While the above embodiments have been described regarding a laser diode, in alternative embodiments the assembly may configured to house and cool other active components. In view of the foregoing, it is intended that the present invention cover modifications and variations of this invention provided they fall within the scope of the following claims and their equivalents.

What is claimed is:

1. A sealable laser diode heat sink module for a laser diode comprising an anode terminal and a cathode terminal, comprising:
   a cathode assembly comprising a cathode base, and a cathode connector plate; and
   an anode assembly comprising:
      an anode base configured to house the laser diode and the cathode base within a sealable cavity recessed into the anode base;
      a cathode base opening between the sealable cavity and an external wall of the anode base configured to receive the cathode connector plate there through; and
      an anode connector plate extending from the anode base,
      wherein an anode current path between the laser diode anode terminal and the anode connector plate passes via direct connections through the anode base to the laser diode anode terminal, a cathode current path between a laser diode cathode lead post and the cathode connector plate passes via direct connections through the cathode base without intervening elements, and the anode base is configured to dissipate heat from the laser diode.

2. The sealable laser diode heat sink module of claim 1, wherein the anode current path and the cathode current path are solderless.

3. The sealable laser diode heat sink module of claim 1, further comprising a sealing portion configured to cover and form a first seal for the sealable cavity.

4. The sealable laser diode heat sink module of claim 3, wherein the sealing portion further comprises a lens assembly.

5. The sealable laser diode heat sink module of claim 4, further comprising a lens holder configured to support an optical element, and a lens cap configured to at least partially cover the optical element.

6. The sealable laser diode heat sink module of claim 5, wherein the lens holder and the optical element comprise a seal for the sealable cavity.

7. The sealable laser diode heat sink module of claim 1, wherein the anode base is formed from a solid block of a conducting material.

8. The sealable laser diode heat sink module of claim 1, further comprising a cathode connector insulator disposed between the cathode base and the anode base configured to electrically insulate the cathode base and the cathode connector from the anode base.

9. The sealable laser diode heat sink module of claim 1, further comprising a cathode connector gasket configured to form a second seal for the sealable cavity around the cathode base opening between the cathode base and the anode base.

10. The sealable laser diode heat sink module of claim 1, further comprising the laser diode.

11. The sealable laser diode heat sink module of claim 10, wherein the laser diode further comprises an open frame laser diode.

12. The sealable laser diode heat sink module of claim 1, wherein the anode current path further comprises a current conducting fastener arranged to fasten the laser diode to the anode base and to conduct current between the anode terminal and the anode base.

13. A method for forming a sealable laser diode heat sink module (200) for a laser diode comprising an anode terminal and a cathode lead post, comprising the steps of:
   forming a cathode assembly of a conducting material comprising a cathode base, and a cathode connector plate;
   forming an anode base of a conducting material;
   forming a sealable cavity within the anode base, the sealable cavity further comprising a cathode base opening between the sealable cavity and an external wall of the anode base;
   receiving the laser diode within the sealable cavity;
   receiving the cathode base within the sealable cavity; and
   extending the cathode connector plate through a cathode base opening,
   forming an anode current path between the laser diode anode terminal and the anode connector plate passes via direct connections through the anode base to the laser diode anode terminal; and
   forming the cathode current path between the laser diode cathode lead post and the cathode connector plate passes via direct connections through the cathode base without intervening elements.

14. The method of claim 13, further comprising the step of attaching an anode connector plate extending from the anode base.

15. The method of claim 13, further comprising the step of forming a sealing portion configured to cover and form a first seal for the sealable cavity.

16. The method of claim 13, further comprising the step of sealing the cathode base opening around the cathode connector plate.

17. A system for sealably mounting a laser diode comprising an anode terminal and a cathode lead post, comprising:
   a heat sink assembly further comprising:
      a cathode assembly comprising a cathode base, and a cathode connector plate; and
      an anode assembly comprising:
         an anode base formed from a solid block of a conducting material configured to house the laser diode and the cathode base within a sealable cavity recessed into the anode base;

a cathode base opening between the sealable cavity and an external wall of the anode base configured to receive the cathode connector plate therethrough; and an anode connector plate extending from the anode base; and a sealing lens assembly portion configured to cover and form a first seal for the sealable cavity, further comprising a holder configured to support an optical element, and a lens cap configured to at least partially cover the optical element, wherein an anode current path between the laser diode anode terminal and the anode connector plate passes via direct connections through the anode base to the laser diode anode terminal, and a cathode current path between the laser diode cathode lead post and the cathode connector plate passes via direct connections through the cathode base without intervening elements.

18. The sealable laser diode heat sink module of claim 17, further comprising a cathode connector gasket configured to form a second seal for the sealable cavity around the cathode base opening between the cathode base and the anode base.

* * * * *